United States Patent
May et al.

(10) Patent No.: US 10,133,803 B2
(45) Date of Patent: Nov. 20, 2018

(54) COVERAGE DATA INTERCHANGE

(71) Applicant: Mentor Graphics Corporation, Wilsonville, OR (US)

(72) Inventors: Darron May, Newbury (GB); Samiran Laha, Fremont, CA (US)

(73) Assignee: Mentor Graphics Corporation, Wilsonville, OR (US)

( * ) Notice: Subject to any disclaimer, the term of this patent is extended or adjusted under 35 U.S.C. 154(b) by 331 days.

(21) Appl. No.: 15/011,276

(22) Filed: Jan. 29, 2016

(65) Prior Publication Data
US 2016/0357834 A1 Dec. 8, 2016

Related U.S. Application Data

(60) Provisional application No. 62/172,663, filed on Jun. 8, 2015.

(51) Int. Cl.
*G06F 17/30* (2006.01)
*H04L 29/08* (2006.01)
*G06F 17/50* (2006.01)

(52) U.S. Cl.
CPC .... *G06F 17/30569* (2013.01); *G06F 17/5081* (2013.01); *H04L 67/02* (2013.01);
(Continued)

(58) Field of Classification Search
CPC .......... G06F 17/5045; G06F 17/30569; G06F 17/5081; G06F 17/30; G06F 17/50;
(Continued)

(56) References Cited

U.S. PATENT DOCUMENTS 6,487,704 B1 * 11/2002 McNamara ...... G01R 31/31704 716/106
6,647,513 B1 * 11/2003 Hekmatpour ......... G06F 11/263 714/33

(Continued)

OTHER PUBLICATIONS

Accellera—"Systems Initiative"—Unified Coverage Interoperabi:ity Standard (UCIS)—Version 1.0—Jun. 2, 2012—pp. 1-60 (Accellera Systems Initiative, 1370 Trancas Street #163, Nepa, CA 94558, USA.*

(Continued)

*Primary Examiner* — Anh Ly
(74) *Attorney, Agent, or Firm* — Mentor Graphics Corporation

(57) ABSTRACT

This application discloses a computing system implementing a source application to extract coverage data from a source database with application program interface (API) routines specific to the source database, and classify the coverage data according to a Unified Coverage Interoperability Standard (UCIS)-compliant format. The coverage data can include at least one of data from verification operations performed on a circuit design, test information utilized during the verification operations, or at least one test plan. The computing system implementing the source application can, based on the classification, select exchange routines to transfer the coverage data towards a target database. The computing system can implement a target application to utilize the classification of the coverage data to identify corresponding API routines specific to the target database, and write the coverage data to the target database with the identified API routines.

17 Claims, 8 Drawing Sheets

(52) U.S. Cl.
CPC ............ *H04L 67/10* (2013.01); *H04L 67/125* (2013.01); *H04L 67/2823* (2013.01)

(58) Field of Classification Search
CPC ............ G06F 2217/04; G06F 2217/12; G06F 17/303; H04L 67/02; H04L 67/10; H04L 67/2823; H04L 67/125; Y02P 90/265; G03F 7/0591
See application file for complete search history.

(56) References Cited

U.S. PATENT DOCUMENTS

| | | | | |
|---|---|---|---|---|
| 7,890,902 | B1* | 2/2011 | Sahu | G06F 17/5022 |
| | | | | 716/106 |
| 8,413,088 | B1* | 4/2013 | Armbruster | G06F 17/504 |
| | | | | 716/100 |
| 8,560,985 | B1* | 10/2013 | Sahu | G06F 17/504 |
| | | | | 716/106 |
| 9,514,036 | B1* | 12/2016 | Dusanapudi | G06F 11/3684 |
| | | | | 714/E11.207 |
| 2002/0002698 | A1* | 1/2002 | Hekmatpour | G06F 11/263 |
| | | | | 716/106 |
| 2004/0025122 | A1* | 2/2004 | Schubert | G06F 17/5022 |
| | | | | 716/106 |
| 2004/0093242 | A1* | 5/2004 | Cadigan | G06Q 40/08 |
| | | | | 705/4 |
| 2005/0128989 | A1* | 6/2005 | Bhagwat | H04K 3/65 |
| | | | | 370/338 |
| 2005/0278576 | A1* | 12/2005 | Hekmatpour | G01R 31/318314 |
| | | | | 714/37 |
| 2007/0066025 | A1* | 3/2007 | Kotani | G03F 1/36 |
| | | | | 438/401 |
| 2008/0172580 | A1* | 7/2008 | Davia | G06F 11/3676 |
| | | | | 714/38.14 |
| 2011/0070841 | A1* | 3/2011 | Caulfield | H04B 17/318 |
| | | | | 455/67.11 |
| 2011/0153368 | A1* | 6/2011 | Pierre | G06Q 10/067 |
| | | | | 705/4 |

OTHER PUBLICATIONS

C. Kuznik, Marcio Oliveira, Gilles Defo & Wolfgang Mueller—"Systematic Application of UCIS to Improve the Automation on Verification Closure" Univeristy of Paderborn/C-LAB D-33102 Paderborn, Germany 2013, pp. 1-9 (Year: 2013).*

* cited by examiner

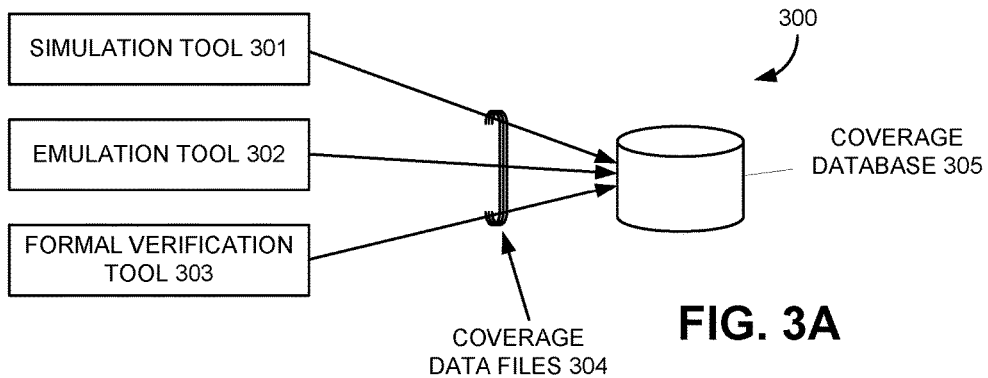

COVERAGE DATA INTERCHANGE

RELATED APPLICATION

This application claims benefit of and priority to U.S. Provisional Patent Application No. 62/172,663, filed Jun. 8, 2015, which is incorporated by reference herein.

TECHNICAL FIELD

This application is generally related to electronic design automation and, more specifically, to interchanging coverage data from design verification operations between different vendor-specific coverage databases.

BACKGROUND

Electronic systems are used in a variety of products, from automobiles to microwaves to personal computers. Designing and fabricating these electronic system typically involves many steps, known as a "design flow." The particular steps of a design flow often are dependent upon the type of electronic system, its complexity, the design team, and the electronic system fabricator or foundry that will manufacture the electronic system. Typically, software and hardware "tools" verify the design at various stages of the design flow by running software simulators and/or hardware emulators, and errors in the design are corrected or the design is otherwise improved.

Several steps are common to most design flows for electronic system. Initially, the specification for a new circuit is transformed into a logical design, sometimes referred to as a register transfer level (RTL) description of the circuit. With this logical design, the circuit can be described in terms of both the exchange of signals between hardware registers and the logical operations that can be performed on those signals. The logical design typically employs a Hardware Design Language (HDL), such as the Very high speed integrated circuit Hardware Design Language (VHDL). The logic of the circuit is then analyzed, to confirm that it will accurately perform the functions desired for the circuit. This analysis is sometimes referred to as "functional verification."

Functional verification typically begins with a circuit design coded at the register transfer level, which can be simulated, emulated, formally verified, or the like, by one or more design verification tools. For example, a designer can generate a test bench that, when simulated or emulated with the circuit design, can allow the design verification tool to analyze the functionality of the simulated or emulated circuit design. When the simulated circuit design operates differently than expected in response to stimulus from the test bench, the designer can attempt to debug the circuit design, for example, to determine which of portions of the circuit design is incorrectly configured, resulting in the generation of illegal states or transitions.

The design verification tool can also attempt to identify how well verification operations, such as simulation, emulation, and/or formal verification, came to covering or adequately exercising the circuit design under verification. Conventional techniques to determine coverage of the circuit design include code coverage and functional coverage. Code coverage, such as statement coverage, branch coverage, decision coverage, condition coverage, expression coverage, toggle coverage, or the like, can identify which lines, statements, expressions, decisions, or toggles of the circuit design were exercised by the test bench during verification operations. Functional coverage can quantify how well a circuit design had its functionality exercised during verification operations.

The design verification tools can collect coverage data during verification operations and record the coverage data into one or more databases based on a coverage data model. Most vendors of these design verification tools utilize a common coverage data model to store coverage data from their own design verification tools, but different vendors often utilize different coverage data models.

A Unified Coverage Interoperability Standard (UCIS) was created to help alleviate this lack of vendor-to-vendor interoperability of coverage data caused by diverse coverage data models. The UCIS defines features a coverage data model is to include in order to be standard-compatible, and also includes recommendations for the coverage data models, for example, with the scope and coveritem building blocks plus attributes and flags. Since the UCIS allows multiple different types of coverage data models to be UCIS-compliant, most of the time, different coverage databases are not binary compatible. As such, the UCIS also defined an exchange format to facilitate transfers or exchanges of coverage data between databases implementing UCIS-compliant, yet differing, coverage data models.

The UCIS utilizes Extensible Markup Language (XML) as the exchange format, which can allow vendors to output coverage data in an XML file and input coverage data in an XML file. While the use of XML as an exchange format can allow for transfers of coverage data between databases having different coverage data models, there are some non-overlapping inconsistencies between an internal coverage data representation of the UCIS and an internal coverage data representation of the XML format. This inconsistency means the UCIS can include coverage data not defined by the XML internal coverage data representation and vice versa. The use of XML for the exchange format of UCIS coverage data can also be verbose, as XML files including the coverage data from a UCIS-compliant database can be hundreds of times larger than the binary representation of the coverage data in the UCIS-compliant database. While XML files may be compressed to reduce this size disparity, compression of the XML file takes time, consumes processing resources, and results in generating compressed XML files that still remain multiple times larger than the binary representation of the coverage data from the UCIS-compliant database.

SUMMARY

This application discloses a computing system to exchange data between two non-binary compatible coverage databases. The computing system can implement a source application to extract coverage data from a source database with application program interface (API) routines specific to the source database, and classify the coverage data according to a Unified Coverage Interoperability Standard (UCIS)-compliant format. The coverage data can include at least one of data from verification operations performed on a circuit design, test information utilized during the verification operations, or at least one test plan. The computing system implementing the source application can, based on the classification, select exchange routines to transfer the coverage data towards a target database. The computing system can implement a target application to utilize the classification of the coverage data to identify corresponding API routines specific to the target database, and write the coverage data to the target database with the identified API routines. Embodiments of coverage data interchange will be described below.

DESCRIPTION OF THE DRAWINGS

FIG. 3A-3E illustrates an example coverage data system storing coverage data files for multiple verification tools that may be implemented according to various embodiments of the invention.

DETAILED DESCRIPTION

Illustrative Operating Environment

Figure 1:
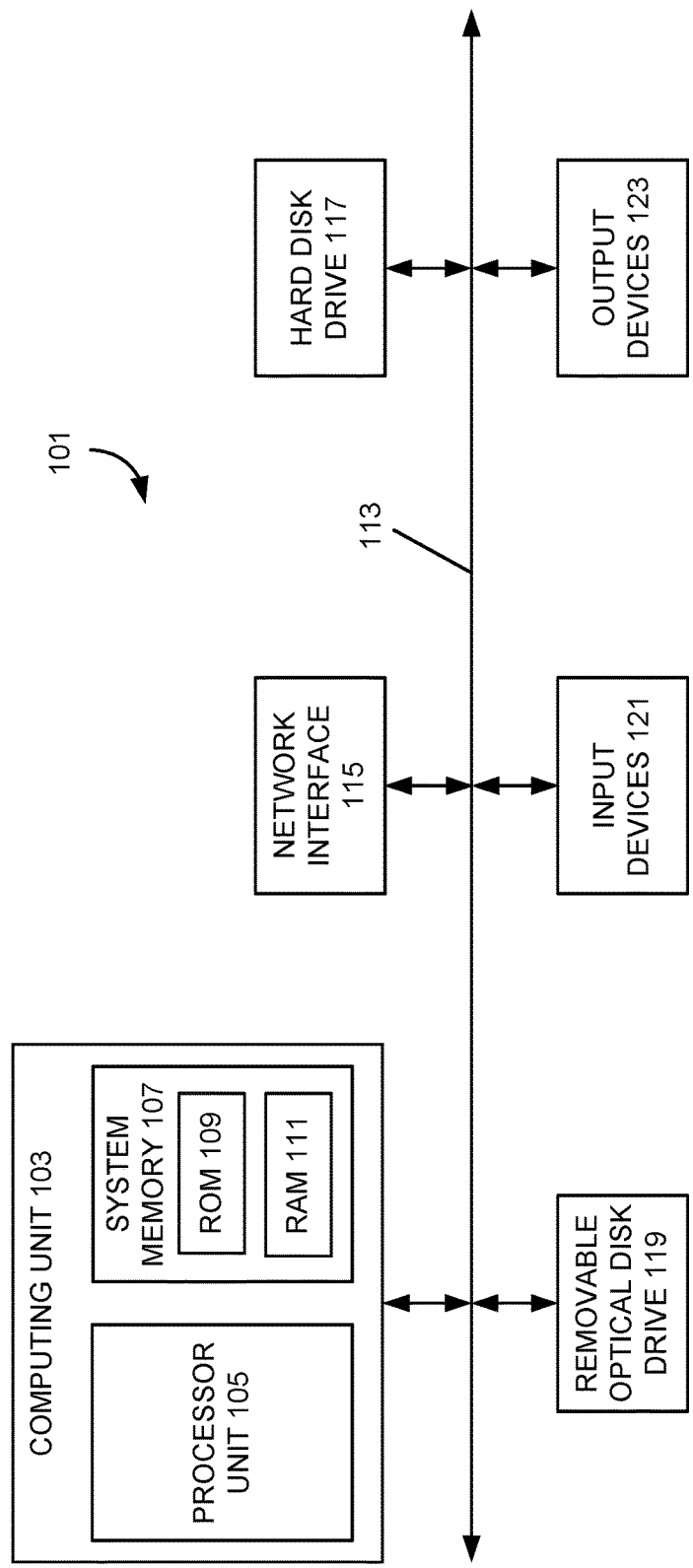
FIGS. 1 and 2 illustrate an example of a computer system of the type that may be used to implement various embodiments of the invention.

Various examples of the invention may be implemented through the execution of software instructions by a computing device 101, such as a programmable computer. Accordingly, FIG. 1 shows an illustrative example of a computing device 101. As seen in this figure, the computing device 101 includes a computing unit 103 with a processing unit 105 and a system memory 107. The processing unit 105 may be any type of programmable electronic device for executing software instructions, but will conventionally be a microprocessor. The system memory 107 may include both a read-only memory (ROM) 109 and a random access memory (RAM) 111. As will be appreciated by those of ordinary skill in the art, both the read-only memory (ROM) 109 and the random access memory (RAM) 111 may store software instructions for execution by the processing unit 105.

The processing unit 105 and the system memory 107 are connected, either directly or indirectly, through a bus 113 or alternate communication structure, to one or more peripheral devices 117-123. For example, the processing unit 105 or the system memory 107 may be directly or indirectly connected to one or more additional memory storage devices, such as a hard disk drive 117, which can be magnetic and/or removable, a removable optical disk drive 119, and/or a flash memory card. The processing unit 105 and the system memory 107 also may be directly or indirectly connected to one or more input devices 121 and one or more output devices 123. The input devices 121 may include, for example, a keyboard, a pointing device (such as a mouse, touchpad, stylus, trackball, or joystick), a scanner, a camera, and a microphone. The output devices 123 may include, for example, a monitor display, a printer and speakers. With various examples of the computing device 101, one or more of the peripheral devices 117-123 may be internally housed with the computing unit 103. Alternately, one or more of the peripheral devices 117-123 may be external to the housing for the computing unit 103 and connected to the bus 113 through, for example, a Universal Serial Bus (USB) connection.

With some implementations, the computing unit 103 may be directly or indirectly connected to a network interface 115 for communicating with other devices making up a network. The network interface 115 can translate data and control signals from the computing unit 103 into network messages according to one or more communication protocols, such as the transmission control protocol (TCP) and the Internet protocol (IP). Also, the network interface 115 may employ any suitable connection agent (or combination of agents) for connecting to a network, including, for example, a wireless transceiver, a modem, or an Ethernet connection. Such network interfaces and protocols are well known in the art, and thus will not be discussed here in more detail.

It should be appreciated that the computing device 101 is illustrated as an example only, and it not intended to be limiting. Various embodiments of the invention may be implemented using one or more computing devices that include the components of the computing device 101 illustrated in FIG. 1, which include only a subset of the components illustrated in FIG. 1, or which include an alternate combination of components, including components that are not shown in FIG. 1. For example, various embodiments of the invention may be implemented using a multi-processor computer, a plurality of single and/or multiprocessor computers arranged into a network, or some combination of both.

Figure 2:
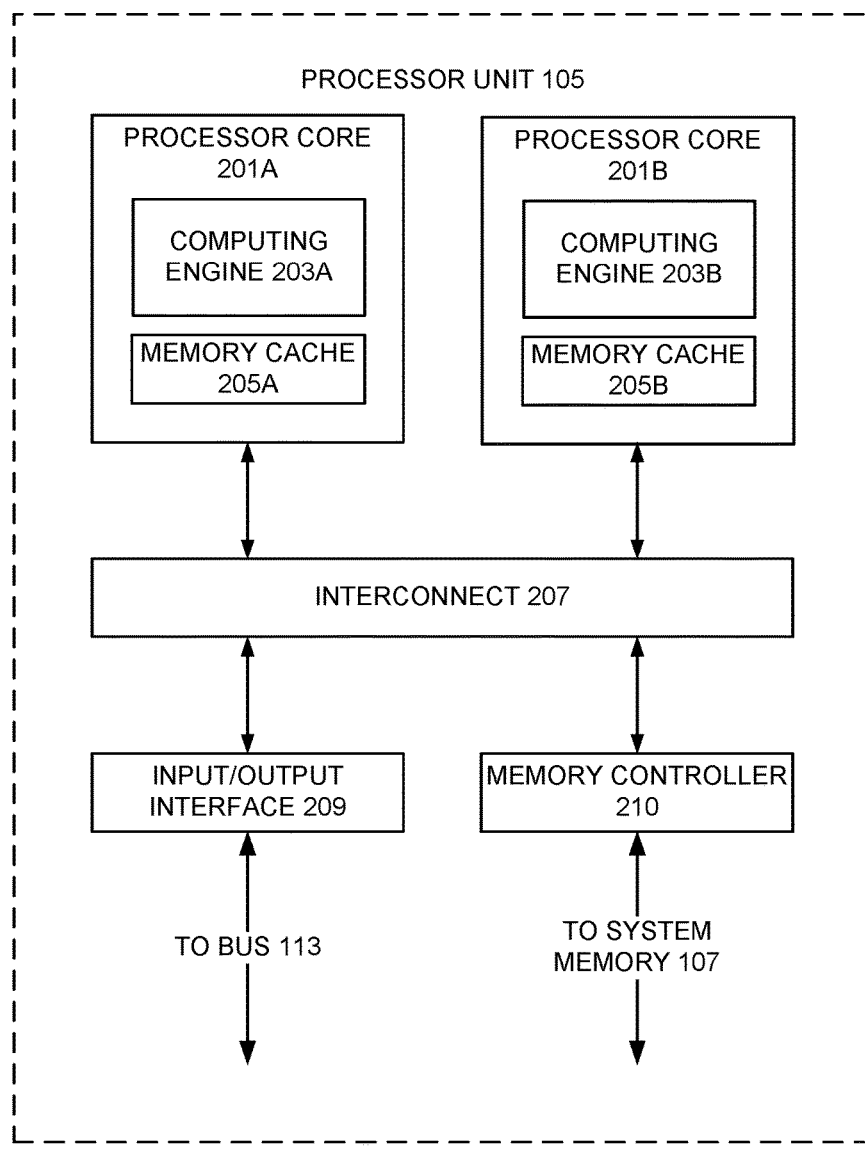

With some implementations of the invention, the processor unit 105 can have more than one processor core. Accordingly, FIG. 2 illustrates an example of a multi-core processor unit 105 that may be employed with various embodiments of the invention. As seen in this figure, the processor unit 105 includes a plurality of processor cores 201A and 201B. Each processor core 201A and 201B includes a computing engine 203A and 203B, respectively, and a memory cache 205A and 205B, respectively. As known to those of ordinary skill in the art, a computing engine 203A and 203B can include logic devices for performing various computing functions, such as fetching software instructions and then performing the actions specified in the fetched instructions. These actions may include, for example, adding, subtracting, multiplying, and comparing numbers, performing logical operations such as AND, OR, NOR and XOR, and retrieving data. Each computing engine 203A and 203B may then use its corresponding memory cache 205A and 205B, respectively, to quickly store and retrieve data and/or instructions for execution.

Each processor core 201A and 201B is connected to an interconnect 207. The particular construction of the interconnect 207 may vary depending upon the architecture of the processor unit 105. With some processor cores 201A and 201B, such as the Cell microprocessor created by Sony Corporation, Toshiba Corporation and IBM Corporation, the interconnect 207 may be implemented as an interconnect bus. With other processor units 201A and 201B, however, such as the Opteron™ and Athlon™ dual-core processors available from Advanced Micro Devices of Sunnyvale, Calif., the interconnect 207 may be implemented as a system request interface device. In any case, the processor cores 201A and 201B communicate through the interconnect 207 with an input/output interface 209 and a memory controller 210. The input/output interface 209 provides a communication interface to the bus 113. Similarly, the memory controller 210 controls the exchange of information to the system memory 107. With some implementations of the invention, the processor unit 105 may include additional components, such as a high-level cache memory accessible shared by the processor cores 201A and 201B. It also should be appreciated that the description of the computer network illustrated in FIG. 1 and FIG. 2 is provided as an example only, and it not intended to suggest any limitation as to the scope of use or functionality of alternate embodiments of the invention.

Multiple Verification Tool Environment

Figure 3B:
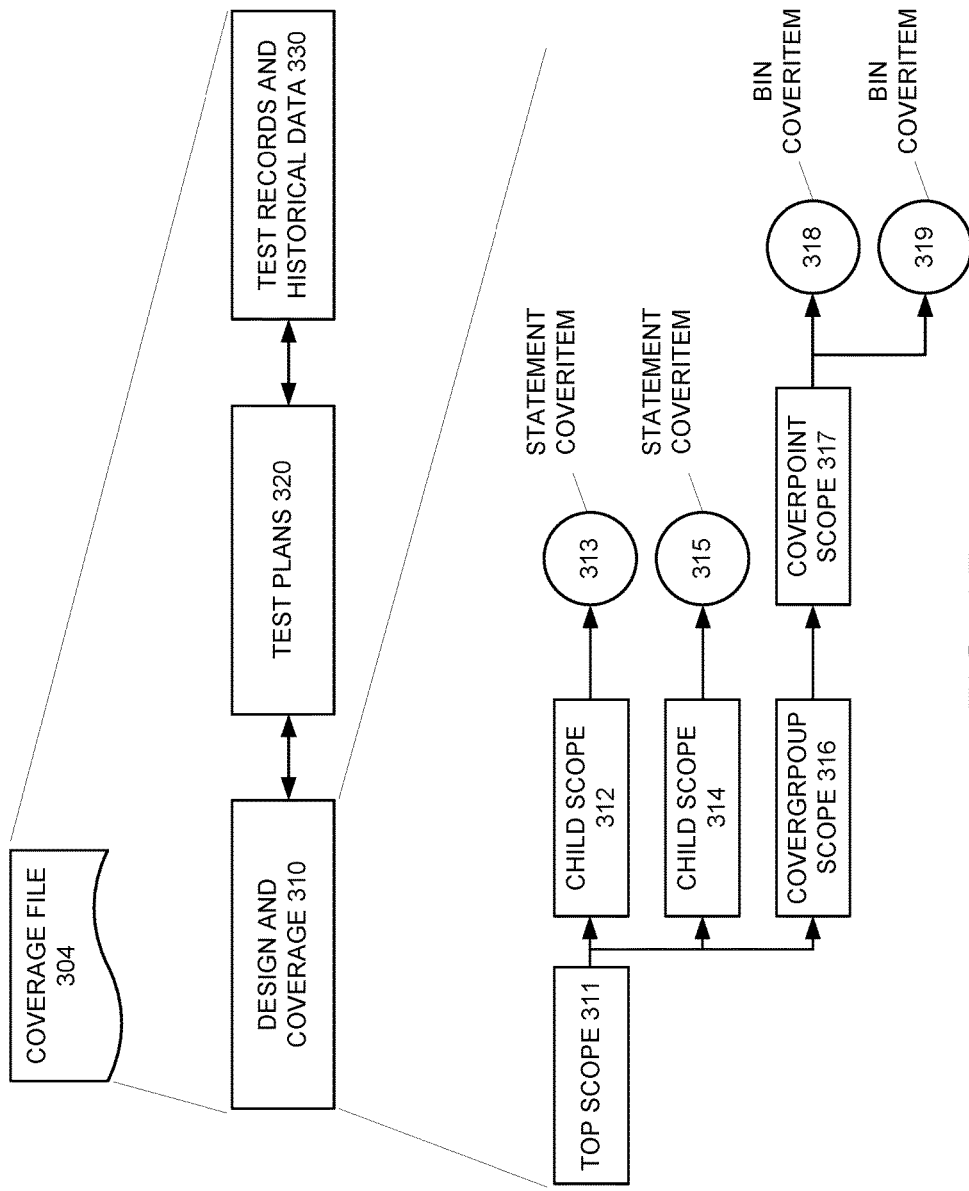

FIG. 3A-3E illustrates an example coverage data system 300 storing coverage data files 304 for multiple verification tools that may be implemented according to various embodiments of the invention. Referring to FIG. 3A, the coverage data system 300 can include multiple verification tools, such as a simulation tool 301, an emulation tool 302, a formal verification tool 303, or the like, to generate coverage data files 304 for storage in a coverage database 305.

The simulation tool 301 and emulation tool 302 can simulate or emulate a test bench and a design under verification, such as the circuit design. The simulated or emulated test bench can generate test stimuli, for example, vectors including clock signals, activation signals, power signals, control signals, data signals, or the like, which can be provided to the simulated or emulated design under verification. The simulated or emulated design under verification, in response to the test stimuli, can generate output, which can be compared to expected output of the design under verification in response to the test stimuli by the simulation tool 301 or emulation tool 302.

The formal verification tool 303 can analyze the circuit design in an attempt to prove or disprove functionality of circuit design utilizing one or more formal techniques, such as a Binary Decision Diagram (BDD), a Boolean Satisfiability (SAT) Solver, an Automatic Test Pattern Generator (ATPG), Cut Point Prover, or the like.

The design verification tools can collect coverage data during verification operations. For example, the design verification tools can record information, such as a hierarchy of the design under verification, a test plan that includes the test bench or other test information, results of the verification operations, and coverage information, such as code coverage or functional coverage. The coverage information can identify how well verification operations, such as simulation, emulation, and/or formal verification, came to covering or adequately exercising the circuit design under verification. In some embodiments, code coverage, such as statement coverage, branch coverage, decision coverage, condition coverage, expression coverage, toggle coverage, or the like, can identify which lines, statements, expressions, decisions, or toggles of the circuit design were exercised by the test bench during verification operations, while functional coverage can quantify how well a circuit design had its functionality exercised during verification operations.

The design verification tools can utilize the recorded information to generate coverage data files 304 that conform to a coverage data model. In some embodiments, the coverage data files 304 generated by the design verification tools can be compliant with a Unified Coverage Interoperability Standard (UCIS), which defines features a coverage data model is to include in order to be standard-compatible. The design verification tools can store the coverage data files 304 into a coverage database 305. In some embodiments, the coverage database 305 can be compliant with the UCIS, meaning it supports coverage data files 304 having standard-compatible coverage data models.

Referring to FIG. 3B, an example of the coverage data file 304 is shown. The coverage data file can include multiple sections, including a design and coverage section 310, a test plan section 320, and a test records and historical data section 330. The design and coverage design section 310 can include data corresponding to a design under verification, such as a hierarchical representation of the circuit design having undergone verification operations by the multiple design verification tools. The design and coverage design section 310 also can include data corresponding to coverage of the circuit design during the verification operations. The test plan section 320 can include information associated with one or more test plans of the verification operations. The test records and historical data section 330 can include information on tests or regressions run on the circuit design during the verification operations. Data from the sections 310-330 can be linked to each other in the coverage database 305.

The coverage portion of the design and coverage design section 310 can be structured or arranged hierarchically according to the UCIS, for example, having basic building blocks of scopes and coveritems. An example of the coverage portion of the design and coverage design section 310 can include multiple coveritems, such as statement coveritems 313 and 315, and bin coveritems 318 and 319. The UCIS coveritems can be constructs having an integral count annotated with information, such as name, type, attributes, or the like, corresponding to what was counted. The coveritems 313, 315, 318, and 319 can be organized by a hierarchy of scopes. In this example, the coverage portion of the design and coverage design section 310 can include a top scope 311 having two child scopes 312 and 314 and a covergroup scope 316. The child scope 312 can have the statement coveritem 313, while child scope 314 can have coveritem 315. The covergroup scope 316 can have another scope below it in the hierarchy of scopes, namely, a coverpoint scope 317. The coverpoint scope 317 can have bin coveritems 318 and 319.

Referring to FIGS. 3C-3E, the scopes and coveritems in the design and coverage design section 310 of FIG. 3B can have corresponding data structures, which can describe the scopes and coveritems, respectively. For example, in FIG. 3C, an example design scope 340 can include information about the design under verification, such as a scope name, a scope type, a source code type, file information, flags associated with the design scope 340, and a weight. In FIG. 3D, an example coverage scope 350 can include information about toggle coverage for a portion of the design under verification, such as a scope name, a scope type, a source code type, file information, flags associated with the design scope 350, a weight, a toggle type, toggle direction, and attributes. In FIG. 3E, an example coveritem 360 can include information about coverage for a portion of the design under verification, such as a coveritem name, a coveritem type, file information, count, and flags associated with the coveritem scope 360.

Data Interchanger

Figure 4:
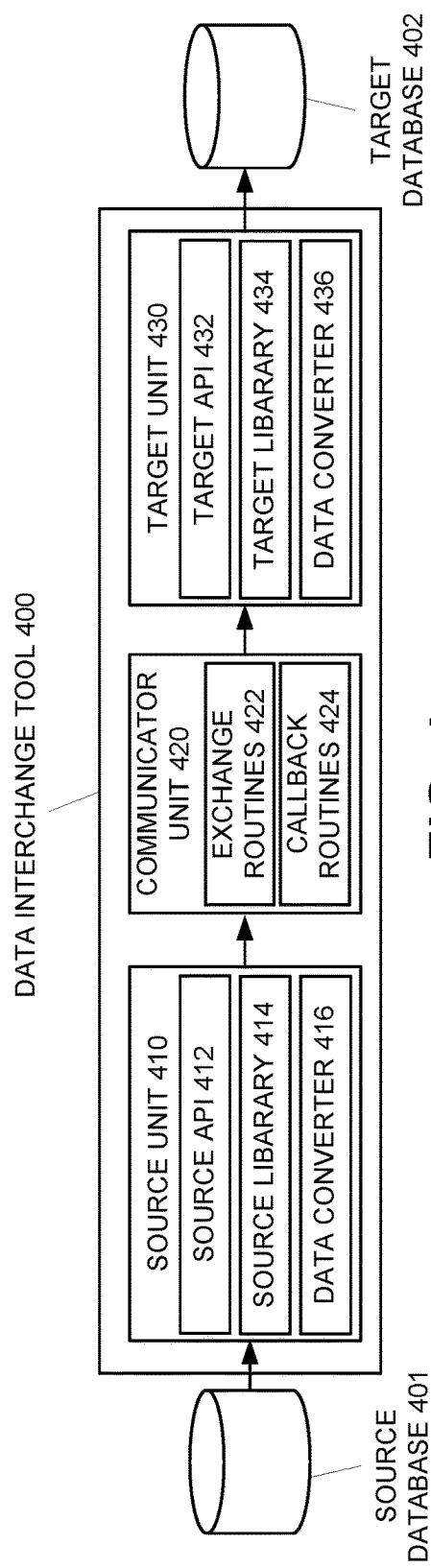
FIG. 4 illustrates an example data interchange tool capable of transferring coverage data between different coverage databases, which may be implemented according to various embodiments of the invention.

FIG. 4 illustrates an example data interchange tool 400 capable of transferring coverage data between different coverage databases, which may be implemented according to various embodiments of the invention. Referring to FIG. 4, a source database 401 can store coverage data in format corresponding to a source coverage data model. The coverage data can include data corresponding to a circuit design, data corresponding to coverage of the circuit design during verification operations, test information utilized during the verification operations, one or more test plans, or the like. The source coverage data model may be UCIS-compliant, meaning the source coverage data model stores the coverage data in a format compliant with the UCIS standard, or the source coverage data model may have a format that is not UCIS-compliant. A target database 402 can store coverage data in format consistent with a target coverage data model. The target coverage data model also may have a format for coverage data that is UCIS-compliant or not UCIS-compliant.

The data interchange tool 400 can extract coverage data from the source database 401 with application program interface (API) routines specific to the source database 401, classify the coverage data according to a UCIS-compliant format, utilize the classification of the coverage data to identify corresponding API routines specific to the target database 402, and write the coverage data to the target database 402 with the identified API routines.

The data interchange tool 400 can include a source unit 410 to extract the coverage data from the source database 401 utilizing the routines from a source API 412. In some embodiments, the source unit 410 can be an executable file that was compiled and linked with a source library 414, such as a UCIS C library, which can define UCIS API routines for the source database 401. The source unit 410 can utilize the source API 412 and the source library 414 to call a first routine that opens the source database 402 and then recursively call a second routine that traverses the source database 401 to locate objects in the source database 401. After the source unit 410 identifies objects in the coverage data, such as scopes or coveritems, the source unit 410, based on execution of the second routine, can extract attributes, flags, or other object information from the source database 401.

The source unit 410 can determine coverage data types for the identified objects based on the source API 412 and the source library 414 utilized to extract the coverage data. The source unit 410, based on the coverage data types, can select one or more exchange routines 422, which can be utilized to transfer the extracted coverage data corresponding to the identified objects. The exchange routines 422 can be included in a communicator unit 420, which, in some embodiments, can be a library of routines accessible by the source unit 410. In some embodiments, the exchange routines 422 can include send_testdata( ) send_cross_scope( ), send_cover( ) or the like. For example, when the source unit 410 extracts coverage data from the source database 401 classified as test data, the source unit 410 can select a send_testdata( ) exchange routine to call in order to transfer the extracted test data.

When the source database 401 is not UCIS-compliant, the source unit 410 can include a data converter 416 to translate coverage data extracted from the source database 401 into a format having a coverage data model that is UCIS-compliant. In some embodiments, the data converter 416 can include a map between non-UCIS-compliant data types in the extracted coverage data and data types in the coverage data model that are UCIS-compliant. The data converter 416 can utilize this map to modify the coverage data extracted from the source database 401 into the format having the coverage data model that is UCIS-compliant. The source unit 410 may determine the coverage data types for the translated data types based on the map utilized to translate the extracted coverage data into the format having the coverage data model that is UCIS-compliant.

The data interchange tool 400 can include a target unit 430 to receive the coverage data transferred by the source unit 410, and write the coverage data into the target database 402 with routines in a target API 432. In some embodiments, the target unit 430 can be an executable file that was compiled and linked with a target library 434, such as a UCIS C library, which can define UCIS API routines for the target database 402. The target unit 430 can utilize the target API 432 and the source library 434 to write coverage data received from the source unit 410 to the target database 402.

In some embodiments, the target unit 430 can register callback routines 424 for function handles corresponding to the exchange routines 422. When the callback routines 424 are executed, the target unit 430 can receive the coverage data from the source unit 410. In some embodiments, the callback routines 424 can include receive_testdata( ) receive_cross_scope( ), receive_cover( ), or the like. The target unit 430, based on the callback routines 424 utilized to transfer the coverage data, can correlate the coverage data to routines in the target API 432 and the target library 434, which the target unit 430 can utilize to write the coverage data to the target database 402.

When the target database 402 is not UCIS-compliant, the target unit 430 can include a data converter 436 to translate the UCIS-compliant coverage data received from the source unit 410 into a format compatible with the target database 402. In some embodiments, the data converter 436 can include a map between target data types and data types in the coverage data model that are UCIS-compliant. The data converter 436 can utilize this map to modify the UCIS-compliant coverage data received from the source unit 410 into the format compatible with the target database 402. The target unit 430 can utilize the callback routines 424 to correlate the translated coverage data to routines in the target API 432 and the target library 434, which the target unit 430 can utilize to write the coverage data to the target database 402.

Figure 5:
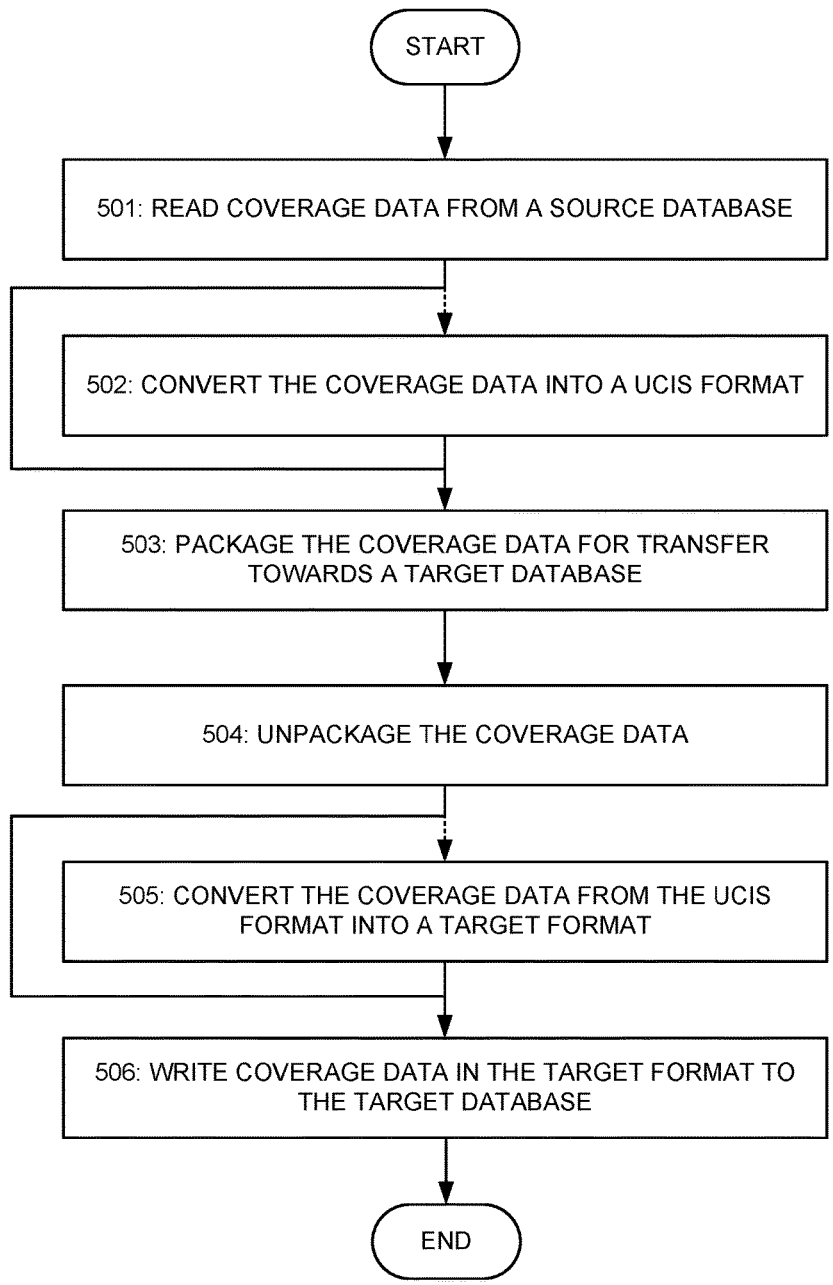
FIG. 5 illustrates a flowchart showing example data interchange of coverage data between a source database and a target database according to various examples of the invention.

FIG. 5 illustrates a flowchart showing example data interchange of coverage data between a source database and a target database according to various examples of the invention. Referring to FIG. 5, in a block 501, a computing system implementing a data interchange tool can read coverage data from a source database. In some embodiments, the computing system can execute a source executable file linked with a source library, such as a UCIS C library, which can define UCIS API routines for the source database. The computing system, in response to executing the source executable file, can call a first routine that opens the source database and then recursively call a second routine that traverses the source database to locate objects in the coverage data. Based on execution of the second routine, the computing system can extract attributes, flags, or other object information from the source database.

In an optional block 502, the computing system implementing the data interchange tool can convert the coverage data into a UCIS format. When the source database is not UCIS-compliant, the computing system executing the source executable file can translate coverage data extracted from the source database into a format having a coverage data model that is UCIS-compliant.

In a block 503, the computing system implementing the data interchange tool can package the coverage data for transfer towards a target database. In some embodiments, the computing system executing the source executable file can utilize exchange routines associated with the UCIS data types read from the source database to transfer the read coverage data towards the target database. The exchange routines can package or packetize the UCIS data types read from the source database for the transfer.

In a block 504, the computing system implementing the data interchange tool can unpackage the coverage data. In some embodiments, the computing system executing a target executable file can utilize callback routines associated with the UCIS data types read from the source database to receive the packaged coverage data and to unpackage the coverage data.

In an optional block 505, the computing system implementing the data interchange tool can convert the coverage data from the UCIS format into a target format. When the target database is not UCIS-compliant, the, computing system executing the target executable file can translate the UCIS-compliant coverage data transferred from the source executable file into a format compatible with the target database.

In a block 506, the computing system implementing the data interchange tool can write coverage data in the target format to the target database. In some embodiments, the target executable file can be compiled and linked with a target library, such as a UCIS C library, which can define UCIS API routines for the target database. The computing system executing the target executable file can utilize the target library to write the coverage data received from the source executable file to the target database.

Figure 6:
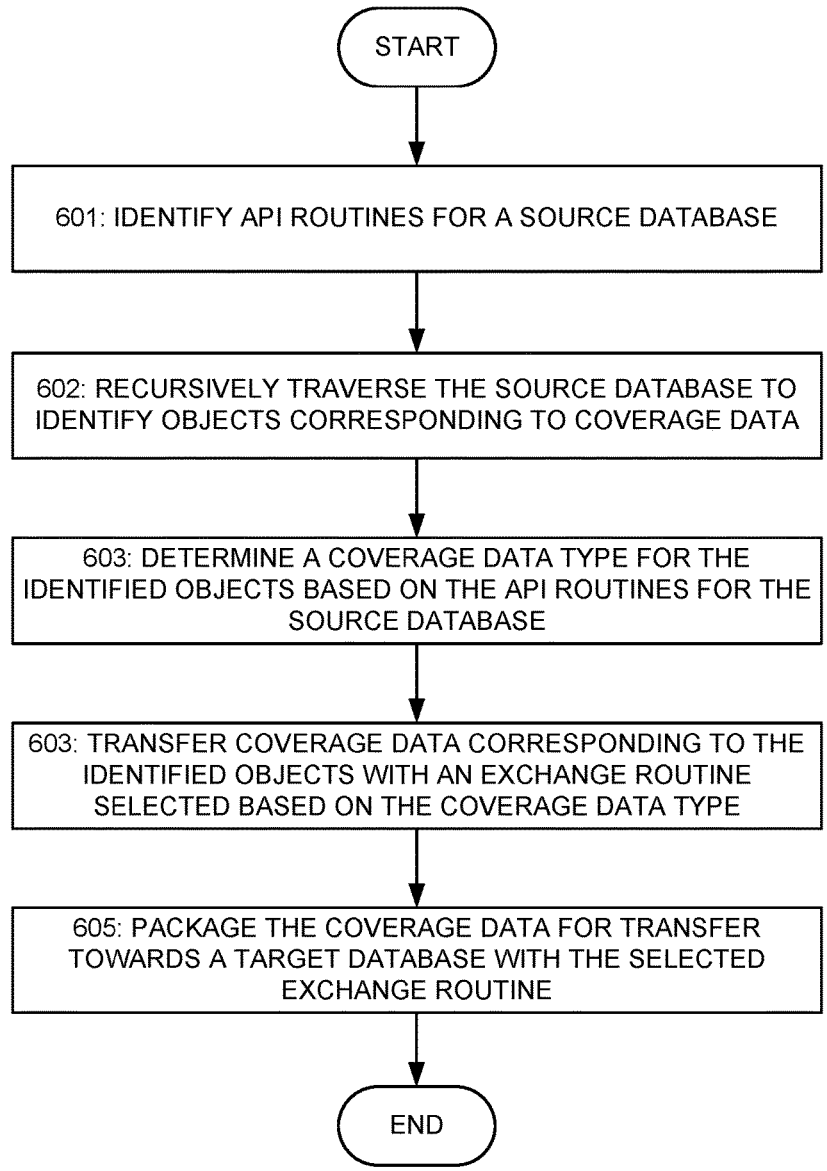
FIG. 6 illustrates a flowchart showing example coverage data extraction from a source database and construction into a UCIS based model according to various examples of the invention.

FIG. 6 illustrates a flowchart showing example coverage data extraction from a source database and construction into a UCIS-based model according to various examples of the invention. Referring to FIG. 6, in a block 601, a computing system implementing a source application in a data interchange tool can identify API routines for a source database, and in a block 602, recursively traverse the source database to identify objects corresponding to coverage data with the API routines. In some embodiments, the source application can be linked with a source library, such as a UCIS C library, which can define UCIS API routines for the source database. The computing system, in response to executing the source application, can recursively call a routine that traverses the source database to locate objects in the coverage data and extracts attributes, flags, or other object information from the source database.

In a block 603, the computing system implementing the source application in the data interchange tool can determine a coverage data type for the identified objects based on the API routines, for example, in the source library. The computing system implementing the source application, based on the coverage data types, can select one or more exchange routines, which can be utilize to transfer the extracted coverage data corresponding to the identified objects.

In a block 604, the computing system implementing the source application in the data interchange tool can transfer coverage data corresponding to the identified objects with an exchange routine selected based on the coverage data type. In a block 605, the computing system implementing the source application in the data interchange tool can package the coverage data for transfer towards a target database with the selected exchange routine.

Figure 7:
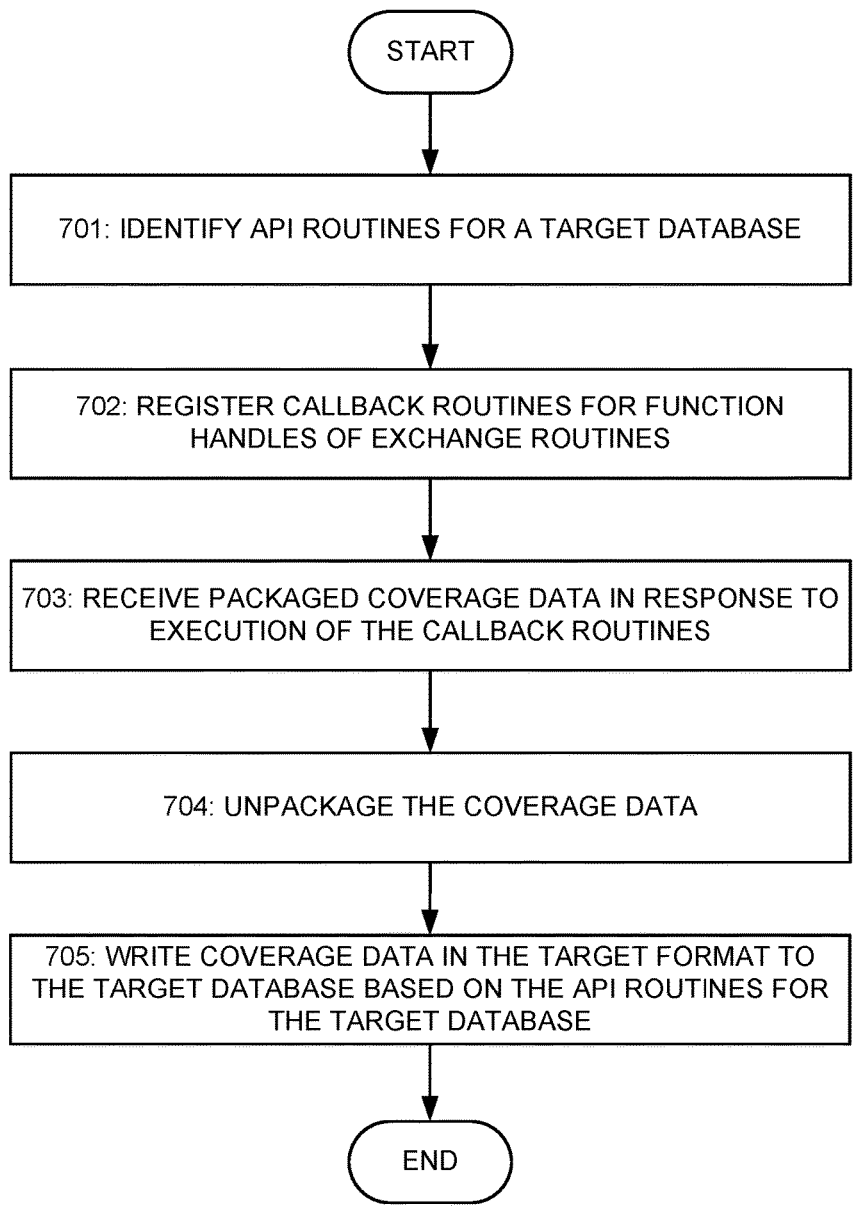
FIG. 7 illustrates a flowchart showing example writing of coverage data into a target database according to various examples of the invention.

FIG. 7 illustrates a flowchart showing example writing of coverage data into a target database according to various examples of the invention. Referring to FIG. 7, in a block 701, a computing system implementing a target application in a data interchange tool can identify API routines for a target database. In a block 702, the computing system implementing the target application in the data interchange tool can register callback routines for function handles of exchange routines.

In a block 703, the computing system implementing the source application in the data interchange tool can receive packaged coverage data. In some embodiments, the target application can receive the package coverage data from the source application based on execution of the callback routines. In a block 704, the computing system implementing the source application in the data interchange tool can unpackage the coverage data.

In a block 705, the computing system implementing the target application in the data interchange tool can write the unpackage coverage data in the target format to the target database based on the API routines for the target database. In some embodiments, the target application can be compiled and linked with a target library, such as a UCIS C library, which can define UCIS API routines for the target database. The computing system executing the target application can utilize the API routines in the target library to write the coverage data received from the source application to the target database.

The system and apparatus described above may use dedicated processor systems, micro controllers, programmable logic devices, microprocessors, or any combination thereof, to perform some or all of the operations described herein. Some of the operations described above may be implemented in software and other operations may be implemented in hardware. Any of the operations, processes, and/or methods described herein may be performed by an apparatus, a device, and/or a system substantially similar to those as described herein and with reference to the illustrated figures.

The processing device may execute instructions or "code" stored in memory. The memory may store data as well. The processing device may include, but may not be limited to, an analog processor, a digital processor, a microprocessor, a multi-core processor, a processor array, a network processor, or the like. The processing device may be part of an integrated control system or system manager, or may be provided as a portable electronic device configured to interface with a networked system either locally or remotely via wireless transmission.

The processor memory may be integrated together with the processing device, for example RAM or FLASH memory disposed within an integrated circuit microprocessor or the like. In other examples, the memory may comprise an independent device, such as an external disk drive, a storage array, a portable FLASH key fob, or the like. The memory and processing device may be operatively coupled together, or in communication with each other, for example by an I/O port, a network connection, or the like, and the processing device may read a file stored on the memory. Associated memory may be "read only" by design (ROM) by virtue of permission settings, or not. Other examples of memory may include, but may not be limited to, WORM, EPROM, EEPROM, FLASH, or the like, which may be implemented in solid state semiconductor devices. Other memories may comprise moving parts, such as a known rotating disk drive. All such memories may be "machine-readable" and may be readable by a processing device.

Operating instructions or commands may be implemented or embodied in tangible forms of stored computer software (also known as "computer program" or "code"). Programs, or code, may be stored in a digital memory and may be read by the processing device. "Computer-readable storage medium" (or alternatively, "machine-readable storage medium") may include all of the foregoing types of memory, as well as new technologies of the future, as long as the memory may be capable of storing digital information in the nature of a computer program or other data, at least temporarily, and as long at the stored information may be "read" by an appropriate processing device. The term "computer-readable" may not be limited to the historical usage of "computer" to imply a complete mainframe, mini-computer, desktop or even laptop computer. Rather, "computer-readable" may comprise storage medium that may be readable by a processor, a processing device, or any computing system. Such media may be any available media that may be locally and/or remotely accessible by a computer or a processor, and may include volatile and non-volatile media, and removable and non-removable media, or any combination thereof.

A program stored in a computer-readable storage medium may comprise a computer program product. For example, a storage medium may be used as a convenient means to store or transport a computer program. For the sake of convenience, the operations may be described as various interconnected or coupled functional blocks or diagrams. However, there may be cases where these functional blocks or diagrams may be equivalently aggregated into a single logic device, program or operation with unclear boundaries.

Conclusion

While the application describes specific examples of carrying out embodiments of the invention, those skilled in the art will appreciate that there are numerous variations and permutations of the above described systems and techniques that fall within the spirit and scope of the invention as set forth in the appended claims. For example, while specific terminology has been employed above to refer to electronic design automation processes, it should be appreciated that various examples of the invention may be implemented using any desired combination of electronic design automation processes.

One of skill in the art will also recognize that the concepts taught herein can be tailored to a particular application in many other ways. In particular, those skilled in the art will recognize that the illustrated examples are but one of many alternative implementations that will become apparent upon reading this disclosure.

Although the specification may refer to "an", "one", "another", or "some" example(s) in several locations, this does not necessarily mean that each such reference is to the same example(s), or that the feature only applies to a single example.

The invention claimed is:

1. A method comprising:
    extracting, by a computing system, coverage data from a source database with application program interface (API) routines specific to the source database;
    classifying, by the computing system, the coverage data according to a Unified Coverage Interoperability Standard (UCIS)-compliant format by identifying objects in the extracted coverage data, determining coverage data types for the identified objects based on the API routines specific to the source database utilized to extract the coverage data, and transferring the extracted coverage data corresponding to the identified objects with exchange routines selected based on the coverage data types;
    utilizing, by the computing system, the classification of the coverage data to identify corresponding API routines specific to a target database; and
    writing, by the computing system, the coverage data to the target database with the identified API routines.

2. The method of claim 1, wherein utilizing the classification of the coverage data to identify corresponding API routines specific to a target database further comprises:
    registering callback routines for function handles corresponding to the exchange routines; and
    correlating the coverage data to API routines specific to the target database based on the callback routines utilized to transfer the coverage data.

3. The method of claim 2, wherein writing the coverage data to the target database is performed with API routines correlated to the coverage data.

4. The method of claim 1, further comprising converting, by the computing system, the coverage data extracted from the source database from a non-UCIS-compliant format into the UCIS-compliant format, wherein the classifying is performed on the converted coverage data.

5. The method of claim 1, further comprising converting, by the computing system, the coverage data from the UCIS-compliant format into a non-UCIS-compliant format that is written to the target database with the identified API routines.

6. The method of claim 1, wherein the coverage data includes at least one of data from verification operations performed on a circuit design, test information utilized during the verification operations, or at least one test plan.

7. A system comprising:
    a memory device configured to store machine-readable instructions; and
    a computing system including one or more processing devices, in response to executing the machine-readable instructions, configured to:
        extract coverage data from a source database with application program interface (API) routines specific to the source database;
        classify the coverage data according to a Unified Coverage Interoperability Standard (UCIS)-compliant format by identifying objects in the extracted coverage data, determining coverage data types for the identified objects based on the API routines specific to the source database utilized to extract the coverage data, and transferring the extracted coverage data corresponding to the identified objects with exchange routines selected based on the coverage data types;
        utilize the classification of the coverage data to identify corresponding API routines specific to a target database; and
        write the coverage data to the target database with the identified API routines.

8. The system of claim 7, wherein the one or more processing devices, in response to executing the machine-readable instructions, are configured to:
    register callback routines for function handles corresponding to the exchange routines; and
    correlate the coverage data to API routines specific to the target database based on the callback routines utilized to transfer the coverage data.

9. The system of claim 7, wherein the one or more processing devices, in response to executing the machine-readable instructions, are configured to convert the coverage data extracted from the source database from a non-UCIS-compliant format into the UCIS-compliant format, wherein the classifying is performed on the converted coverage data.

10. The system of claim 7, wherein the one or more processing devices, in response to executing the machine-readable instructions, are configured to convert the coverage data from the UCIS-compliant format into a non-UCIS-compliant format that is written to the target database with the identified API routines.

11. The system of claim 7, wherein the coverage data includes at least one of data from verification operations performed on a circuit design, test information utilized during the verification operations, or at least one test plan.

12. An apparatus comprising at least one computer-readable memory device storing instructions configured to cause one or more processing devices to perform operations comprising:

extracting coverage data from a source database with application program interface (API) routines specific to the source database;

classifying the coverage data according to a Unified Coverage Interoperability Standard (UCIS)-compliant format by identifying objects in the extracted coverage data, determining coverage data types for the identified objects based on the API routines specific to the source database utilized to extract the coverage data, and transferring the extracted coverage data corresponding to the identified objects with exchange routines selected based on the coverage data types;

utilizing the classification of the coverage data to identify corresponding API routines specific to a target database; and writing the coverage data to the target database with the identified API routines.

13. The apparatus of claim 12, wherein utilizing the classification of the coverage data to identify corresponding API routines specific to a target database further comprises:

registering callback routines for function handles corresponding to the exchange routines; and correlating the coverage data to API routines specific to the target database based on the callback routines utilized to transfer the coverage data.

14. The apparatus of claim 13, wherein writing the coverage data to the target database is performed with API routines correlated to the coverage data.

15. The apparatus of claim 12, wherein the instruction are configured to cause one or more processing devices to perform operations further comprising converting the coverage data extracted from the source database from a non-UCIS-compliant format into the UCIS-compliant format, wherein the classifying is performed on the converted coverage data.

16. The apparatus of claim 12, wherein the instruction are configured to cause one or more processing devices to perform operations further comprising converting the coverage data from the UCIS-compliant format into a non-UCIS-compliant format that is written to the target database with the identified API routines.

17. The apparatus of claim 12, wherein the coverage data includes at least one of data from verification operations performed on a circuit design, test information utilized during the verification operations, or at least one test plan.

* * * * *